(12) United States Patent
Ahn et al.

(10) Patent No.: US 7,205,218 B2
(45) Date of Patent: Apr. 17, 2007

(54) METHOD INCLUDING FORMING GATE DIELECTRICS HAVING MULTIPLE LANTHANIDE OXIDE LAYERS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 207 days.

(21) Appl. No.: 10/163,686

(22) Filed: Jun. 5, 2002

(65) Prior Publication Data

US 2003/0228747 A1    Dec. 11, 2003

(51) Int. Cl.
*H01L 21/3205* (2006.01)
(52) U.S. Cl. .................... 438/591; 438/216; 438/261
(58) Field of Classification Search ............. 438/591, 438/216, 261, 287
See application file for complete search history.

(56) References Cited

U.S. PATENT DOCUMENTS

| | | | |
|---|---|---|---|
| 3,381,114 A | 4/1968 | Nakanuma | 219/385 |
| 4,058,430 A | 11/1977 | Suntola et al. | 427/255.13 |
| 4,215,156 A | 7/1980 | Dalal et al. | 427/84 |
| 4,333,808 A | 6/1982 | Bhattacharyya et al. | 204/192 D |
| 4,394,673 A | 7/1983 | Thompson et al. | 357/15 |
| 4,399,424 A | 8/1983 | Rigby | 338/34 |
| 4,413,022 A | 11/1983 | Suntola et al. | 427/255.2 |
| 4,590,042 A | 5/1986 | Drage | 422/186.06 |
| 4,647,947 A | 3/1987 | Takeoka et al. | 346/135.1 |
| 4,725,887 A | 2/1988 | Field | 348/578 |
| 4,767,641 A | 8/1988 | Kieser et al. | 427/38 |
| 4,920,071 A | 4/1990 | Thomas | 437/188 |
| 4,993,358 A | 2/1991 | Mahawili | 118/715 |
| 5,006,192 A | 4/1991 | Deguchi | 156/345 |
| 5,032,545 A | 7/1991 | Doan et al. | 437/242 |
| 5,089,084 A | 2/1992 | Chhabra et al. | 438/706 |
| 5,426,603 A | 6/1995 | Nakamura et al. | |
| 5,455,489 A | 10/1995 | Bhargava | |

(Continued)

FOREIGN PATENT DOCUMENTS

EP    1096042    5/2001

(Continued)

OTHER PUBLICATIONS

Kwo, J., et al., "High ε gate dielectrics $Gd_2O_3$ and $Y_2O_3$ for silicon", *Applied Physics Letters*, 77(1), (Jul. 3, 2000), 130-132.

(Continued)

*Primary Examiner*—Thanh Nguyen
(74) *Attorney, Agent, or Firm*—Schwegman, Lundberg, Woessner & Kluth, P.A.

(57) ABSTRACT

A dielectric film having a layer of a lanthanide oxide and a layer of another lanthanide oxide, and a method of fabricating such a dielectric film produce a reliable gate dielectric with a equivalent oxide thickness thinner than attainable using $SiO_2$. A gate dielectric may be formed as a nanolaminate of a lanthanide oxide and a lanthanide oxide selected from the group consisting of $Nd_2O_3$, $Sm_2O_3$, $Gd_2O_3$, and $Dy_2O_3$ by electron beam evaporation. These gate dielectrics having a lanthanide oxide nanolaminate are thermodynamically stable such that the nanolaminate forming the gate dielectric will have minimal reactions with a silicon substrate or other structures during processing.

43 Claims, 4 Drawing Sheets

U.S. PATENT DOCUMENTS

| | | | |
|---|---|---|---|
| 5,595,606 A | 1/1997 | Fujikawa et al. | 118/725 |
| 5,674,563 A | 10/1997 | Tarui et al. | |
| 5,674,574 A | 10/1997 | Atwell et al. | 427/561 |
| 5,698,022 A | 12/1997 | Glassman et al. | 106/287.18 |
| 5,735,960 A | 4/1998 | Sandhu et al. | 118/723 IR |
| 5,756,404 A | 5/1998 | Friedenreich et al. | 438/791 |
| 5,789,030 A | 8/1998 | Rolfson | 429/309 |
| 5,795,808 A | 8/1998 | Park | 438/301 |
| 5,801,105 A | 9/1998 | Yano et al. | 438/785 |
| 5,810,923 A | 9/1998 | Yano et al. | 117/84 |
| 5,822,256 A | 10/1998 | Bauer et al. | 365/200 |
| 5,828,080 A | 10/1998 | Yano et al. | 257/43 |
| 5,840,897 A | 11/1998 | Kirlin et al. | 546/2 |
| 5,950,925 A | 9/1999 | Fukunaga et al. | 239/132.3 |
| 5,963,833 A | 10/1999 | Thakur | 438/677 |
| 5,994,240 A | 11/1999 | Thakur | 438/758 |
| 6,010,969 A | 1/2000 | Vaartstra | 438/758 |
| 6,013,553 A | 1/2000 | Wallace et al. | 438/287 |
| 6,020,024 A | 2/2000 | Maiti et al. | 427/248.1 |
| 6,025,627 A | 2/2000 | Forbes et al. | 257/321 |
| 6,027,961 A | 2/2000 | Maiti et al. | 438/199 |
| 6,057,271 A | 5/2000 | Kenjiro et al. | 505/475 |
| 6,059,885 A | 5/2000 | Ohashi et al. | 118/730 |
| 6,093,944 A | 7/2000 | VanDover | 257/310 |
| 6,110,529 A | 8/2000 | Gardiner et al. | 427/250 |
| 6,114,252 A | 9/2000 | Donohoe et al. | 438/710 |
| 6,120,531 A | 9/2000 | Zhou et al. | 607/111 |
| 6,127,287 A | 10/2000 | Hurley et al. | 438/791 |
| 6,161,500 A | 12/2000 | Kopacz et al. | 118/723 E |
| 6,171,900 B1 | 1/2001 | Sun | 438/240 |
| 6,184,146 B1 | 2/2001 | Donohoe et al. | 438/710 |
| 6,187,484 B1 | 2/2001 | Glass et al. | 430/5 |
| 6,203,613 B1 | 3/2001 | Gates et al. | 117/104 |
| 6,203,726 B1 | 3/2001 | Danielson et al. | 252/301 |
| 6,206,972 B1 | 3/2001 | Dunham | 118/715 |
| 6,207,589 B1 | 3/2001 | Ma et al. | 438/785 |
| 6,211,035 B1 | 4/2001 | Moise et al. | 438/396 |
| 6,217,645 B1 | 4/2001 | Vaartstra | 106/287.18 |
| 6,218,293 B1 | 4/2001 | Kraus et al. | 438/644 |
| 6,225,168 B1 | 5/2001 | Gardner et al. | 438/287 |
| 6,225,237 B1 | 5/2001 | Vaartstra | 438/778 |
| 6,258,637 B1 | 7/2001 | Wilk et al. | |
| 6,273,951 B1 | 8/2001 | Vaartstra | 117/104 |
| 6,281,144 B1 | 8/2001 | Cleary et al. | 438/780 |
| 6,294,813 B1 | 9/2001 | Forbes et al. | 257/321 |
| 6,297,539 B1 | 10/2001 | Ma et al. | 257/410 |
| 6,300,203 B1 | 10/2001 | Buynoski et al. | 438/287 |
| 6,302,964 B1 | 10/2001 | Umotoy et al. | 118/715 |
| 6,303,481 B2 | 10/2001 | Park | 438/591 |
| 6,303,500 B1 | 10/2001 | Jiang et al. | 438/678 |
| 6,313,035 B1 | 11/2001 | Sandhu et al. | 438/681 |
| 6,331,465 B1 | 12/2001 | Forbes et al. | 438/260 |
| 6,365,519 B2 | 4/2002 | Kraus et al. | 438/688 |
| 6,368,398 B2 | 4/2002 | Vaartstra | 106/287.18 |
| 6,368,518 B1 | 4/2002 | Vaartstra | 216/67 |
| 6,368,941 B1 | 4/2002 | Chen et al. | 438/424 |
| 6,380,579 B1 | 4/2002 | Nam et al. | 257/306 |
| 6,387,712 B1 | 5/2002 | Yano et al. | 438/3 |
| 6,391,769 B1 | 5/2002 | Lee et al. | 438/643 |
| 6,404,027 B1 | 6/2002 | Hong et al. | |
| 6,432,779 B1 | 8/2002 | Hobbs et al. | 438/287 |
| 6,441,417 B1 | 8/2002 | Zhang et al. | |
| 6,444,039 B1 | 9/2002 | Nguyen | 118/715 |
| 6,444,592 B1 | 9/2002 | Ballantine et al. | |
| 6,445,023 B1 | 9/2002 | Vaartstra et al. | 257/295 |
| 6,451,641 B1 | 9/2002 | Halliyal et al. | 438/200 |
| 6,454,912 B1 | 9/2002 | Ahn et al. | |
| 6,455,717 B1 | 9/2002 | Vaartstra | 556/1 |
| 6,458,701 B1 | 10/2002 | Chae et al. | 438/680 |
| 6,461,970 B1 | 10/2002 | Yin | 438/791 |
| 6,465,334 B1 | 10/2002 | Buynoski et al. | 438/591 |
| 6,472,321 B2 | 10/2002 | Srinivasan et al. | 438/680 |
| 6,495,436 B2 | 12/2002 | Ahn et al. | 438/591 |
| 6,498,063 B1 | 12/2002 | Ping | 438/253 |
| 6,509,280 B2 | 1/2003 | Choi | |
| 6,514,828 B2 | 2/2003 | Ahn et al. | 438/297 |
| 6,518,610 B2 | 2/2003 | Yang et al. | 257/295 |
| 6,521,911 B2 | 2/2003 | Parsons et al. | 257/52 |
| 6,524,867 B2 | 2/2003 | Yang et al. | 438/3 |
| 6,524,901 B1 | 2/2003 | Trivedi | 438/183 |
| 6,527,866 B1 | 3/2003 | Matijasevic et al. | 118/719 |
| 6,531,354 B2 * | 3/2003 | Maria et al. | 438/216 |
| 6,534,420 B2 | 3/2003 | Ahn et al. | 438/768 |
| 6,537,613 B1 | 3/2003 | Senzaki et al. | 427/250 |
| 6,544,875 B1 | 4/2003 | Wilk | 438/591 |
| 6,551,929 B1 | 4/2003 | Kori et al. | |
| 6,573,199 B2 | 6/2003 | Sandhu et al. | 438/798 |
| 6,586,349 B1 | 7/2003 | Jeon et al. | |
| 6,586,792 B2 | 7/2003 | Ahn et al. | 257/295 |
| 6,590,252 B2 | 7/2003 | Kutsunai et al. | |
| 6,592,661 B1 | 7/2003 | Thakur et al. | 117/2 |
| 6,592,942 B1 | 7/2003 | Van Wijck | |
| 6,593,610 B2 | 7/2003 | Gonzalez | 257/296 |
| 6,608,378 B2 | 8/2003 | Ahn et al. | 257/701 |
| 6,613,656 B2 | 9/2003 | Li | 438/584 |
| 6,613,702 B2 | 9/2003 | Sandhu et al. | 438/798 |
| 6,627,503 B2 | 9/2003 | Ma et al. | 438/287 |
| 6,632,279 B1 | 10/2003 | Ritala et al. | |
| 6,638,859 B2 | 10/2003 | Sneh et al. | |
| 6,639,267 B2 | 10/2003 | Eldridge | 257/310 |
| 6,642,573 B1 | 11/2003 | Halliyal et al. | |
| 6,645,882 B1 | 11/2003 | Halliyal et al. | 438/785 |
| 6,652,924 B2 | 11/2003 | Sherman | |
| 6,656,371 B2 | 12/2003 | Drewes | 216/22 |
| 6,656,835 B2 | 12/2003 | Marsh et al. | 438/650 |
| 6,660,660 B2 * | 12/2003 | Haukka et al. | 438/778 |
| 6,661,058 B2 | 12/2003 | Ahn et al. | 257/344 |
| 6,670,284 B2 | 12/2003 | Yin | 438/759 |
| 6,673,701 B1 | 1/2004 | Marsh et al. | 438/493 |
| 6,674,138 B1 | 1/2004 | Halliyal et al. | |
| 6,677,250 B2 | 1/2004 | Campbell et al. | 438/758 |
| 6,682,602 B2 | 1/2004 | Vaartstra | 118/715 |
| 6,683,005 B2 | 1/2004 | Sandhu et al. | 438/715 |
| 6,696,332 B2 | 2/2004 | Visokay et al. | 438/216 |
| 6,699,747 B2 | 3/2004 | Ruff et al. | |
| 6,709,989 B2 | 3/2004 | Ramdani et al. | |
| 6,713,846 B1 * | 3/2004 | Senzaki | 257/635 |
| 6,730,575 B2 | 5/2004 | Eldridge | 257/310 |
| 6,750,066 B1 | 6/2004 | Cheung et al. | 458/3 |
| 6,754,108 B2 | 6/2004 | Forbes | |
| 6,767,795 B2 | 7/2004 | Ahn et al. | |
| 6,777,353 B2 | 8/2004 | Putkonen | |
| 6,780,704 B1 | 8/2004 | Raaijmakers et al. | |
| 6,787,413 B2 | 9/2004 | Ahn et al. | |
| 6,790,791 B2 | 9/2004 | Ahn et al. | |
| 6,812,100 B2 | 11/2004 | Ahn et al. | |
| 6,821,862 B2 | 11/2004 | Cho | |
| 6,821,873 B2 | 11/2004 | Visokay et al. | |
| 6,828,045 B1 | 12/2004 | Tokailin et al. | |
| 6,831,315 B2 | 12/2004 | Raaijmakers et al. | |
| 6,844,203 B2 | 1/2005 | Ahn et al. | |
| 6,858,120 B2 | 2/2005 | Ahn et al. | |
| 6,858,444 B2 | 2/2005 | Ahn et al. | |
| 6,893,984 B2 | 5/2005 | Ahn et al. | |
| 6,900,122 B2 | 5/2005 | Ahn et al. | |
| 6,914,800 B2 | 7/2005 | Ahn et al. | |
| 6,921,702 B2 | 7/2005 | Ahn et al. | |
| 6,930,346 B2 | 8/2005 | Ahn et al. | |
| 6,958,302 B2 | 10/2005 | Ahn et al. | |
| 6,979,855 B2 | 12/2005 | Ahn et al. | |
| 6,989,573 B2 | 1/2006 | Ahn et al. | |
| 7,045,430 B2 | 5/2006 | Ahn et al. | |
| 2001/0030352 A1 | 10/2001 | Ruff et al. | |
| 2001/0042505 A1 | 11/2001 | Vaartstra | 117/104 |

| | | | | | | |
|---|---|---|---|---|---|---|
| 2002/0068466 A1 | 6/2002 | Lee et al. | | 2004/0183108 A1 | 9/2004 | Ahn |
| 2002/0086507 A1 | 7/2002 | Park et al. ............... 438/585 | | 2004/0185654 A1 | 9/2004 | Ahn |
| 2002/0086555 A1 | 7/2002 | Ahn et al. ................. 438/783 | | 2004/0214399 A1 | 10/2004 | Ahn et al. |
| 2002/0089023 A1 | 7/2002 | Yu et al. ..................... 257/411 | | 2004/0222476 A1 | 11/2004 | Ahn et al. |
| 2002/0089063 A1 | 7/2002 | Ahn et al. .................. 257/762 | | 2004/0262700 A1 | 12/2004 | Ahn et al. |
| 2002/0090806 A1 | 7/2002 | Ahn et al. .................. 438/618 | | 2005/0009370 A1 | 1/2005 | Ahn |
| 2002/0094632 A1 | 7/2002 | Agarwal et al. | | 2005/0020017 A1 | 1/2005 | Ahn et al. |
| 2002/0110991 A1 | 8/2002 | Li .............................. 438/387 | | 2005/0023574 A1 | 2/2005 | Forbes et al. |
| 2002/0111001 A1 | 8/2002 | Ahn et al. .................. 438/592 | | 2005/0023594 A1 | 2/2005 | Ahn et al. |
| 2002/0122885 A1 | 9/2002 | Ahn ...................... 427/255.28 | | 2005/0023595 A1 | 2/2005 | Forbes et al. |
| 2002/0130338 A1 | 9/2002 | Ahn et al. .................. 257/295 | | 2005/0023602 A1 | 2/2005 | Forbes et al. |
| 2002/0146916 A1 | 10/2002 | Irino et al. ................. 438/785 | | 2005/0023603 A1 | 2/2005 | Eldridge et al. |
| 2002/0155688 A1 | 10/2002 | Ahn et al. .................. 438/592 | | 2005/0023624 A1 | 2/2005 | Ahn et al. |
| 2002/0155689 A1 | 10/2002 | Ahn et al. ....................... 29/76 | | 2005/0023625 A1 | 2/2005 | Ahn et al. |
| 2002/0167089 A1 | 11/2002 | Ahn et al. .................. 257/762 | | 2005/0023626 A1 | 2/2005 | Ahn et al. |
| 2002/0192974 A1 | 12/2002 | Ahn et al. .................. 438/722 | | 2005/0023627 A1 | 2/2005 | Ahn et al. |
| 2002/0192975 A1 | 12/2002 | Ahn | | 2005/0026349 A1 | 2/2005 | Forbes et al. |
| 2002/0192979 A1 | 12/2002 | Ahn | | 2005/0026374 A1 | 2/2005 | Ahn et al. |
| 2003/0001212 A1 | 1/2003 | Hu et al. .................... 257/388 | | 2005/0029547 A1 | 2/2005 | Ahn et al. |
| 2003/0003635 A1 | 1/2003 | Paranjpe et al. | | 2005/0029604 A1 | 2/2005 | Ahn et al. |
| 2003/0003702 A1 | 1/2003 | Ahn et al. .................. 438/591 | | 2005/0029605 A1 | 2/2005 | Ahn et al. |
| 2003/0003722 A1 | 1/2003 | Vaartstra .................... 438/656 | | 2005/0030825 A1 | 2/2005 | Ahn |
| 2003/0003730 A1 | 1/2003 | Li .............................. 438/768 | | 2005/0032292 A1 | 2/2005 | Ahn et al. |
| 2003/0008243 A1 | 1/2003 | Ahn et al. .................. 430/314 | | 2005/0032342 A1 | 2/2005 | Forbes et al. |
| 2003/0017717 A1 | 1/2003 | Ahn et al. .................. 438/768 | | 2005/0037563 A1 | 2/2005 | Ahn |
| 2003/0020169 A1 | 1/2003 | Ahn et al. .................. 257/762 | | 2005/0054165 A1 | 3/2005 | Ahn et al. |
| 2003/0020180 A1 | 1/2003 | Ahn et al. .................. 257/786 | | 2005/0077519 A1 | 4/2005 | Ahn et al. |
| 2003/0032270 A1 | 2/2003 | Snyder et al. | | 2005/0124174 A1 | 6/2005 | Ahn et al. |
| 2003/0042526 A1 | 3/2003 | Weimer ...................... 257/309 | | 2005/0124175 A1 | 6/2005 | Ahn et al. |
| 2003/0043637 A1 | 3/2003 | Forbes et al. | | 2005/0138262 A1 | 6/2005 | Forbes |
| 2003/0045060 A1 | 3/2003 | Ahn | | 2005/0145957 A1 | 7/2005 | Ahn et al. |
| 2003/0045078 A1 | 3/2003 | Ahn et al. | | 2005/0158973 A1 | 7/2005 | Ahn et al. |
| 2003/0048666 A1 | 3/2003 | Eldridge et al. ........ 365/185.28 | | 2005/0164521 A1 | 7/2005 | Ahn et al. |
| 2003/0049942 A1 | 3/2003 | Haukka et al. | | 2005/0227442 A1 | 10/2005 | Ahn et al. |
| 2003/0052356 A1 | 3/2003 | Yang et al. .................. 257/309 | | 2005/0277256 A1 | 12/2005 | Ahn et al. |
| 2003/0052358 A1 | 3/2003 | Weimer ...................... 257/310 | | 2005/0280067 A1 | 12/2005 | Ahn et al. |
| 2003/0059535 A1 | 3/2003 | Luo et al. | | 2006/0000412 A1 | 1/2006 | Ahn et al. |
| 2003/0102501 A1 | 6/2003 | Yang et al. .................. 257/295 | | 2006/0001151 A1 | 1/2006 | Ahn et al. |
| 2003/0104666 A1 | 6/2003 | Bojarczuk, Jr. et al. | | 2006/0003517 A1 | 1/2006 | Ahn et al. |
| 2003/0119246 A1 | 6/2003 | Ahn | | 2006/0024975 A1 | 2/2006 | Ahn et al. |
| 2003/0119291 A1 | 6/2003 | Ahn et al. | | 2006/0026716 A1 | 2/2006 | Sivasankar et al. |
| 2003/0119313 A1 | 6/2003 | Yang et al. .................. 438/681 | | 2006/0043492 A1 | 3/2006 | Ahn et al. |
| 2003/0132491 A1 | 7/2003 | Ahn | | 2006/0043504 A1 | 3/2006 | Ahn et al. |
| 2003/0157764 A1 | 8/2003 | Ahn et al. .................. 438/212 | | 2006/0046505 A1 | 3/2006 | Ahn et al. |
| 2003/0183306 A1 | 10/2003 | Hehmann et al. | | 2006/0046522 A1 | 3/2006 | Ahn et al. |
| 2003/0193061 A1 | 10/2003 | Osten | | | | |
| 2003/0207032 A1 | 11/2003 | Ahn et al. | | | FOREIGN PATENT DOCUMENTS | |
| 2003/0207540 A1 | 11/2003 | Ahn et al. | | | | |
| 2003/0207564 A1 | 11/2003 | Ahn et al. .................. 438/638 | | JP | 62-199019 | 9/1987 |
| 2003/0207593 A1 | 11/2003 | Derderian et al. .......... 438/778 | | JP | 5090169 | 4/1993 |
| 2003/0222300 A1 | 12/2003 | Basceri et al. .............. 257/310 | | JP | 2001-332546 | 11/2001 |
| 2003/0227033 A1 | 12/2003 | Ahn et al. .................. 257/213 | | WO | WO0540993 A1 * | 5/1993 |
| 2003/0235961 A1 | 12/2003 | Metzner et al. | | WO | WO-02/31875 | 4/2002 |
| 2004/0004244 A1 | 1/2004 | Ahn et al. .................. 257/314 | | | | |
| 2004/0004245 A1 | 1/2004 | Forbes et al. ............... 237/315 | | | OTHER PUBLICATIONS | |
| 2004/0004247 A1 | 1/2004 | Forbes et al. ............... 257/324 | | | | |
| 2004/0004859 A1 | 1/2004 | Forbes et al. .......... 365/185.05 | | | | |
| 2004/0007171 A1 | 1/2004 | Ritala et al. | | | | |
| 2004/0009679 A1 | 1/2004 | Yeo et al. | | | | |
| 2004/0023461 A1 | 2/2004 | Ahn et al. | | | | |
| 2004/0033681 A1 | 2/2004 | Ahn et al. .................. 438/591 | | | | |
| 2004/0033701 A1 | 2/2004 | Ahn et al. .................. 438/785 | | | | |
| 2004/0038554 A1 | 2/2004 | Ahn | | | | |
| 2004/0043541 A1 | 3/2004 | Ahn | | | | |
| 2004/0043569 A1 | 3/2004 | Ahn | | | | |
| 2004/0043635 A1 | 3/2004 | Vaartstra | | | | |
| 2004/0110348 A1 | 6/2004 | Ahn et al. | | | | |
| 2004/0110391 A1 | 6/2004 | Ahn et al. | | | | |
| 2004/0144980 A1 | 7/2004 | Ahn et al. | | | | |
| 2004/0159863 A1 | 8/2004 | Eldridge et al. | | | | |
| 2004/0164357 A1 | 8/2004 | Ahn et al. | | | | |
| 2004/0164365 A1 | 8/2004 | Ahn et al. | | | | |
| 2004/0175882 A1 | 9/2004 | Ahn et al. | | | | |

Kwo, J., "Properties of high k gate dielectrics $Gd_2O_3$ and $Y_2O_3$ for Si", *Journal of Applied Physics*, 89(7), (2001), 3920-3927.

Stathis, J. H., et al., "Reliability Projection for Ultra-Thin Oxides at Low Voltage", *Tech. Dig. International Electron Device Meeting*, (1998), 167-9.

Aarik, Jaan, et al., "Phase transformations in hafnium dioxide thin films grown by atomic layer deposition at high temperatures", *Applied Surface Science*, 173, (2001), pp. 15-21.

Aarik, Jaan, et al., "Texture development in nanocrystalline hafnium dioxide thin films grown by atomic layer deposition", *Journal of Crystal Growth*, (2000), pp. 105-113.

Bright, A. A., et al., "Low-rate plasma oxidation of Si in a dilute oxygen/helium plasma for low-temperature gate quality $Si/Sio_2$ interfaces", *Applied Physics Letters*, (Feb. 1991), pp. 619-621.

Cheng, Baohong, et al., "The Impact of High-κ Gate Dielectrics and Metal Gate Electrodes on Sub-100nm MOSFET's", *IEEE Transactions on Electron Devices*, (Jul. 1999), pp. 1537-1544.

Copel, M., et al., "Structure and stability of ultrathin zirconium oxide layers on Si(001)", *Applied Physics Letters*, vol. 76, No. 4, (Jan. 24, 2000), pp. 436-438.

Desu, S.B., "Minimization of Fatigue in Ferroelectric Films", *Phys. Stat. Sol. (a)* 151, (1995), pp. 467-480.

Engelhardt, M., "Modern Applications of Plasma Etching and Patterning in Silicon Process Technology", *Contrib. Plasma. Phys.*, 39(5), (1999), pp. 473-478.

Forsgren, Katarina, et al., "Atomic Layer Deposition of $HfO_2$ using hafnium iodide", *Conference held in Monterey, California*, (May 2001), 1 page.

Fuyuki, Takashi, et al., "Electronic Properties of the Interface between Si and $TiO_2$ Deposited at Very Low Temperatures", *Journal of Applied Physics*, (1986), pp. 1288-1291.

Fuyuki, Takashi, et al., "Initial stage of ultra-thin $SiO_2$ formation at low temperatures using activated oxygen", *Applied Surface Science*, (1997), pp. 123-126.

Gartner, M., et al., "Spectroellipsometric characterization of lanthanide-doped $TiO_2$ films obtained via the sol-gel technique", *Thin Solid Films*, (1993), pp. 561-565.

Geller, S., et al., "Crystallographic Studies of Perovskite-like Compounds. II. Rare Earth Aluminates", *Acta Cryst.* vol. 9, (1956), pp. 1019-1025.

Giess, E. A., et al., "Lanthanide gallate perovskite-type substrates for epitaxial, high-$T_c$ superconducting $Ba_2YCu_3O_{7\delta}$films", *IBM J. Res. Develop.* vol. 34, No. 6, (Nov. 6, 1990), pp. 916-926.

Hirayama, Masaki, et al., "Low-Temperature Growth of High-Integrity Silicon Oxide Films by Oxygen Radical Generated in High Density Krypton Plasma", *IEDM Technical Digest*, (1999), pp. 249-252.

Hubbard, K. J., et al., "Thermodynamic stability of binary oxides in contact with silicon", *J. Mater. Res.*, (Nov. 1996), pp. 2757-2776.

Hunt, C. E., et al., "Direct bonding of micromachined silicon wafers for laser diode heat exchanger applications", *J. Micromech. Microeng.*, 1, (1991), pp. 152-156.

Iddles, D. M., et al., "Relationships between dopants, microstructure and the microwave dielectric properties of $ZrO_2$-$TiO_2$-$SnO_2$ ceramics", *Journal of Materials Science*, vol. 27, (1992), pp. 6303-6310.

Jeon, Sanghun, et al., "Excellent Electrical Characteristics of Lanthanide (Pr, Nd, Sm, Gd, and Dy) Oxide and Lanthanide-doped Oxide ofr MOS Gate Dielectric Applications", *Technical Digest of IEDM*, (2001),pp. 471-474.

Jeong, Chang-Wook, et al., "Plasma-Assisted Atomic Layer Growth of High-Quality Aluminum Oxide Thin Films", *Japanese Journal of Applied Physics*, (Jan. 2001), pp. 285-289.

Kawai, Y., et al., "Ultra-low-temperature growth of high-integrity gate oxide films by low-energy Ion-assisted oxidation", *Applied Physics Letters*, 64(17), (Apr. 1994), pp. 2223-2225.

Keomany, D., et al., "Sol gel preparation of mixed cerium-titanium oxide thin films", *Solar Energy Materials and Solar Cells*, (1994), pp. 429-441.

Kim, C. T., et al., "Application of $Al_2O_3$ Grown by Atomic Layer Deposition to DRAM and FeRAM", *International Symposium in Integrated Ferroelectrics*, (Mar. 2000), p. 316.

Kim, D., et al., "Atomic Control of Substrate Termination and Heteroepitaxial Growth of $SrTiO_3/LaAlO_3$ Films", *Journal of the Korean Physical Society*, vol. 36 No. 6, (Jun. 2000), pp. 444-448.

Kim, Y., et al., "Substrate dependence on the optical properties of Al2O3 films grown by atomic layer deposition", *Applied Physics Letters*, 71(25), (Dec. 1997), pp. 3604-3606.

Krauter, G., et al., "Room Temperature Silicon Wafer Bonding with Ultra-Thin Polymer Films", *Advanced Materials*, 9(5), (1997), pp. 417-420.

Kukli, Kaupo, et al., "Atomic Layer Deposition of Titanium Oxide $TiI_4$ and $H_2O_2$", *Chem. Vap. Deposition*, vol. 6, No. 6, (2000), pp. 303-310.

Kukli, K., et al., "Controlled Growth of Yttrium Oxysulphide Thin Films by Atomic Layer Deposition", *Materials Science Forum*, (1999), pp. 216-221.

Lee, A. E., et al., "Epitaxially grown sputtered $LaAlO_3$ films", *Appl. Phys. Lett.* 57 (19), (Nov. 5, 1990), pp. 2019-2021.

Lee, Cheng-Chung, et al., "Ion-assisted deposition of silver thin films", *Thin Solid Films*, (2000), pp. 95-97.

Lee, Dong H., et al., "Metalorganic chemical vapor deposition of $Tio_2$:n anatase thin film on Si substrate", *Applied Physics Letters*, (Feb. 1995), pp. 815-816.

Lee, L. P., et al., "Monolithic 77 K dc SQUID magnetometer", *Appl. Phys. Lett.* 59(23), (Dec. 2, 1991), pp. 3051-3053.

Lee, C. H., et al., "MOS Characteristics of Ultra Thin Rapid Thermal CVD $ZrO_2$ and Zr Silicate Gate Dielectrics", *IEDM*, (2000), pp. 27-30.

Lee, C. H., et al., "MOS Devices with High Quality Ultra Thin CVD $ZrO_2$ Gate Dielectrics and Self-Aligned TaN and TaN/Poly-Si Gate electrodes", *2001 Symposium on VLSI, Technology Digest of Technical Papers*, (2001), pp. 137-138.

Lee, Byoung H., et al., "Ultrathin Hafnium Oxide with Low Leakage and Excellent Reliability for Alternative Gate Dielectric Application", *Technical Digest of IEDM*, (1999), pp. 133-136.

Leskela, M., et al., "ALD precursor chemistry: Evolution and future challenges", *J. Phys. IV France*, (1999), pp. 837-852.

Liu, C. T., "Circuit Requirement and Integration Challenges of Thin Gate Dielectrics for Ultra Small MOSFETs", *IEDM*, (1998), pp. 1.1-1.4.

Liu, Y. C., et al., "Growth of ultrathin $SiO_2$ on Si by surface irradiation with an $O_2$+Ar electron cyclotron resonance microwave plasma at low temperatures", *Journal of Applied Physics*, vol. 85, No. 3, (Feb. 1999), pp. 1911-1915.

Lucovsky, G., et al., "Microscopic model for enhanced dielectric constants in low concentration $SiO_2$-rich noncrystalline Zr and Hf silicate alloys", *Applied Physics Letters*, vol. 77, No. 18, (Oct. 2000), pp. 2912-2914.

Luo, "Ultra-thin ZrO2 (or Silicate) with High Thermal Stability for CMOS Gate Applications", *2001 Symposium on VLSI Technology Digest of Technical Papers*, pp. 135-136.

Martin, P. J., et al., "Ion-beam-assisted deposition of thin films", *Applied Optics*, vol. 22, No. 1, (Jan. 1983), pp. 178-184.

Molodyk, A. A., et al., "Volatile Surfactant-Assisted MOCVD: Application to $LaAl0_3$ Thin Film Growth", *Chem. Vap. Deposition*, vol. 6, No. 3, (2000), pp. 133-138.

Molsa, Heini, et al., "Growth of Yttrium Oxide Thin Films from β-Diketonate Precursor", *Advanced Materials for Optics and Electronics*, vol. 4, (1994), pp. 389-400.

Muller, D. A., et al., "The electronic structure at the atomic scale of ultrathin gate oxides", *Nature*, vol. 399, (Jun. 24, 1999, pp. 758-761.

Nakagawara, Osamu, et al., "Electrical properties of (Zr, Sn)TiO4 dielectric thin film prepared by pulsed laser deposition", *J. Appl. Phys.*, 80(1), (Jul. 1, 1996), pp. 388-392.

Neumayer, D. A., et al., "Materials characterization of $ZrO_2$-$SiO_2$ and $HfO_2$-$SiO_2$ binary oxides deposited by chemical solution deposition", *Journal of Applied Physics*, vol. 90, No. 4, (Aug. 2001), pp. 1801-1808.

Nieminen, Minna, et al., "Formation and stability of lanthanum oxide thin films deposited from β-diketonate precursor", *Applied Surface Science*, 174, (2001), pp. 155-165.

Ohring, Milton, "The Materials Science of Thin Films", *Academic Press Inc.*, (1992), pp. 118,121,125.

Osten, H. J., et al., "High-κ Gate Dielectrics with Ultra-low Leakage Current Based on Praseodymium Oxide", *Technical Digest of IEDM*, (2000), pp. 653-656.

Pan, Tung M., et al., "High Quality Ultrathin $CoTiO_3$ High-κ Gate Dielectrics", *Electrochemical and Solid-State Letters*, 3(9), (2000), pp. 433-434.

Pan, Tung M., et al., "High-κ cobalt-titanium oxide dielectrics formed by oxidation of sputtered Co/Ti or Ti/Co films", *Applied Physics Letters*, (Mar. 2001), pp. 1439-1441.

Park, Byung-Eun, et al., "Electrical properties of $LaAlO_3$/Si and $Sr_{0.8}Bi_{2.2}Ta_2O_9/LaAlO_3$/Si structures", *Applied Physics Letters*, vol. 79, No. 6, (Aug. 6, 2001), pp. 806-808.

Perkins, Charles M., et al., "Electrical and materials properties of $ZrO_2$ gate dielectrics grown by atomic layer chemical vapor deposition", *Applied Physics Letters*, vol. 78, No. 16, (Apr. 16, 2001), pp. 2357-2359.

Qi, Wen-Jie, et al., "MOSCAP and MOSFET characteristics using $ZrO_2$ gate dielectric deposited directly on Si", *IEDM Technical Digest*, (1999), pp. 145-148.

Qi, Wen-Jie, et al., "Performance of MOSFETs with ultra thin $ZrO_2$ and Zr-silicate gate dielectrics", *2000 Symposium on VLSI Technology, Digest of Technical Papers*, (2000), pp. 40-41.

Ramakrishnan, E. S., et al., "Dielectric Properties of Radio Frequency Magnetron Sputter Deposited Zirconium Titanate-Based Thin Films", *J. Electrochem. Soc.*, vol. 145, No. 1, (Jan. 1998), pp. 358-362.

Rayner Jr., G., et al., "The Structure of Plasma-Deposited and Annealed Pseudo-Binary $ZrO_2$-$SiO_2$ Alloys", *Material Res. Soc. Symp.*, vol. 611, (2000), pp. C1.3.1-C1.3.9.

Ritala, Mikko, "Atomic Layer Epitaxy Growth of Titanium, Zirconium and Hafnium Dioxide Thin Films", *Annales Academiae Scientiarum Fennicae*, (1994), pp. 24-25.

Ritala, Mikko, et al., "Zirconium dioxide thin films deposited by ALE using zirconium tetrachloride as precursor", *Applied Surface Science*, vol. 75, (1994), pp. 333-340.

Saito, Yuji, et al., "Advantage of Radical Oxidation for Improving Reliability of Ultra-Thin Gate Oxide", *2000 Symposium on VLSI Technology Digest of Technical Papers*, (2000), pp. 176-177.

Saito, Yuji, et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999), pp. 152-153.

Shanware, A., et al., "Reliability evaluation of HfSiON gate dielectric film with 12.8 Å $SiO_2$ equivalent thickness", *2001 International Electron Devices Meeting*, pp. 137-140.

Shin, Chang H., et al., "Fabriation and Characterization of MFISFET using $Al_2O_3$ Insulating Layer for Non-Volatile Memory", *12th International Symposium in Integrated Ferroelectrics*, (Mar. 2000), pp. 1-9.

Song, Hyun-Jung, et al., "Atomic Layer Deposition of $Ta_2O_5$ Films Using $Ta(OC_2H_5)_5$ and $NH_3$", *Mat. Res. Soc. Symp. Proc.*, (1999), pp. 469-471.

Suntola, T., "Atomic Layer Epitaxy", *Handbook of Crystal Growth, 3; Thin Films of Epitaxy, Part B: Growth Mechanics and Dynamics*, Amsterdam, (1994), pp. 602-663.

Suntola, T., "Atomic layer epitaxy", *Thin Solid Films*, 216, (1992), pp. 84-89.

Sze, S. M., *Physics of Semiconductor Devices*, (1981), p. 431.

Sze, S. M., *Physics of Semiconductor Devices*, (1981), p. 473.

Takemoto, J. H., et al., "Microstrip Resonators and Filters Using High-TC Superconducting Thin Films on $LaAlO_3$", *IEEE Transaction on Magnetics*, vol. 27, No. 2, (Mar. 1991), pp. 2549-2552.

Tarre, A., et al., "Comparative study of low-temperature chloride atomic-layer chemical vapor deposition of $TiO_2$ and $SnO_2$", *Applied Surface Science*, (2001), pp. 111-116.

Van Dover, R. B., "Amorphous lanthanide-doped $TiO_x$ dielectric films", *Applied Physics Letters*, vol. 74, No. 20 (May 1999), pp. 3041-3043.

Van Dover, Robert B., et al., "Deposition of Uniform Zr-Sn-Ti-O films by ON-Axis Reactive Sputtering", *IEEE Electron Device Letters*, vol. 19, No. 9, (Sep. 1998), pp. 329-331.

Van Dover, R. B., et al., "Discovery of a useful thin-film dielectric using a composition-spread approach", *Letters to Nature*, (1997), 3 pages.

Viirola, H., et al., "Controlled growth of antimony-doped tin dioxide thin films by atomic layer epitaxy", *Thin Solid Films*, (1994), pp. 127-135.

Viirola, H . et al., "Controlled growth of tin oxide thin films by atomic layer epitaxy", *Thin Solid Films*, (1994), pp. 144-149.

Wilk, G. D., et al., "Hafnium and zirconium silicates for advanced gate dielectrics", *Journal of Applied Physics*, vol. 87, No. 1, (Jan. 2000), pp. 484-492.

Wilk, G. D., et al., "High-κ gate dielectrics: Current status and materials properties considerations", *J. Appl. Phys.*, vol. 89, No. 10, (May 15, 2001), pp. 5243-5275.

Wolf, Stanley, et al., "Silicon Processing for the VLSI Era—vol. I: Process Technology", *Second Edition, Lattice Press*, Sunset Beach, California, (2000), p. 443.

Yamaguchi, Takeshi, et al., "Band Diagram and Carrier Conduction Mechanism in $ZrO2$/Zr-silicate/Si MIS Structure Fabricated by Pulsed-laser-ablation Deposition", *IEDM*, (2000), pp. 19-22.

Zhang, H., "Atomic Layer Deposition of High Dielectric Constant Nanolaminates", *Journal of The Electrochemical Society*, 148(4), (Apr. 2001), F63-F66.

Zhang, H., et al., "High permittivity thin film nanolaminates", *Journal of Applied Physics*, vol. 87, No. 4, (Feb. 15, 2000), pp. 1921-1924.

Zhu W., et al., "$HfO_2$ and HfAlO for CMOS: Thermal Stability and Current Tranport", *IEEE International Electron Device Meeting 2001*, (2001), pp. 463-466.

Zucker, O., et al., "Application of Oxygen Plasma Processing to Silicon Direct Bonding", *Sensors and Actuators A*, 36, (1993), pp. 227-231.

Ohmi, S. , et al., "Rare Earth Metal Oxides for High-K Gate Insulator", *Electrochemical Society Proceedings*, vol. 2002-2, (2002),376-387.

Ahn, Kie Y., et al., "ALD of Amorphous Lanthanide Doped Tiox Films", U.S. Appl. No. 11/092,072, filed Mar. 29, 2005.

Ahn, Kie Y., et al., "Atomic Layer Deposited Hafnium Tantalum Oxide Dielectrics", U.S. Appl. No. 11/029,757, filed Jan. 5, 2005.

Ahn, Kie Y., et al., "Atomic Layer Deposited Lanthanum Aluminum Oxide Dielectric Layer", U.S. Appl. No. 10/930,167, filed Aug. 31, 2004.

Ahn, Kie Y., et al., "Atomic Layer Deposited Lanthanum Hafnium Oxide Dielectrics", U.S. Appl. No. 11/010,529, filed Dec. 13, 2004.

Ahn, Kie Y., et al., "Atomic Layer Deposited Titanium Aluminum Oxide Films", U.S. Appl. No. 10/931,533, filed Aug. 31, 2004.

Ahn, Kie Y., et al., "Atomic Layer Deposition of Hf3N4/HfO2 Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Atomic Layer Deposition of Zr3N4/ZrO2 Films as Gate Dielectrics", U.S. Appl. No. 11/058,563, filed Feb. 15, 2005.

Ahn, Kie Y., et al., "Hybrid ALD-CVD of PrXOY/ZrO2 Films as Gate Dielectrics", U.S. Appl. No. 11/010,766, filed Dec. 13, 2004.

Ahn, Kie Y., et al., "Ruthenium Gate for a Lanthanide Oxide Dielectric Layer", U.S. Appl. No. 10/926,812, filed Aug. 26, 2004.

"Praseodymium Oxide, Pr2O3 For Optical Coating", *Technical Publication by CERAC about Praseodymium Oxide*, http://www.cerac.com/pubs/proddata/pr2o3.htm,(Sep. 21, 2005),1-2.

Chin, A. , et al., "High Quality La2O3 and Al2O3 Gate Dielectrics with Equivalent Oxide Thickness 5-10Å", *Digest of Technical Papers, 2000 Symposium on VLSI Technology*, 2000, Honolulu,(Jun. 13-15, 2000), 16-17.

Copel, M. , et al., "Formation of a stratified lanthanum silicate dielectric by reaction with Si(001)", *Applied Physics Letters*, 78(11), (Mar. 12, 2001), 1607-1609.

Guha, S , et al., "Atomic beam deposition of lanthanum-and yttrium-based oxide thin films for gate dielectrics", *Applied Physics Letters*, 77, (2000), 2710-2712.

Maria, J. P., et al., "High temperature stability in lanthanum and zirconia-based gate dielectrics", *Journal of Applied Physics*, 90(7), (Oct. 1, 2001), 3476-3482.

Bunshah, Rointan F., et al., "Deposition Technologies for Films and Coatings: Developments and Applications", *Park Ridge, N.J., U.S. A. : Noyes Publications*, (1982),102-103.

Wolf, S. , et al., *In: Silicon Processing of the VLSI Era*, vol. 1, Lattice Press,374-380.

\* cited by examiner

METHOD INCLUDING FORMING GATE DIELECTRICS HAVING MULTIPLE LANTHANIDE OXIDE LAYERS

RELATED APPLICATIONS

This application is related to the following, co-pending, commonly assigned applications, incorporated herein by reference:

U.S. application Ser. No. 10/027,315, now U.S. Pat. No. 6,900,122 entitled: "Low-Temperature Grown High-Quality Ultra-Thin Praseodymium Gate Dielectrics."

FIELD OF THE INVENTION

The invention relates to semiconductor devices and device fabrication. Specifically, the invention relates to gate dielectric layers of transistor devices and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, or memory devices such as DRAMs. The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. The transistor 100 is fabricated in a substrate 110 that is typically silicon, but could be fabricated from other semiconductor materials as well. The transistor 100 has a first source/drain region 120 and a second source/drain region 130. A body region 132 is located between the first source/drain region and the second source/drain region, where the body region 132 defines a channel of the transistor with a channel length 134. A gate dielectric, or gate oxide 140 is located on the body region 132 with a gate 150 located over the gate dielectric. Although the gate dielectric can be formed from materials other than oxides, the gate dielectric is typically an oxide, and is commonly referred to as a gate oxide. The gate may be fabricated from polycrystalline silicon (polysilicon), or other conducting materials such as metal may be used.

In fabricating transistors to be smaller in size and reliably operating on lower power supplies, one important design criteria is the gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. In typical processing, use of $SiO_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than $SiO_2$, but increased scaling and other requirements for gate dielectrics create the need to find other dielectric materials to be used for a gate dielectric.

What is needed is an alternate dielectric material for forming a gate dielectric that has a high dielectric constant relative to $SiO_2$, and is thermodynamically stable with respect to silicon such that forming the dielectric on a silicon layer will not result in $SiO_2$ formation, or diffusion of material, such as dopants, into the gate dielectric from the underlying silicon layer.

DETAILED DESCRIPTION OF THE PREFERRED EMBODIMENTS

Figure 1:
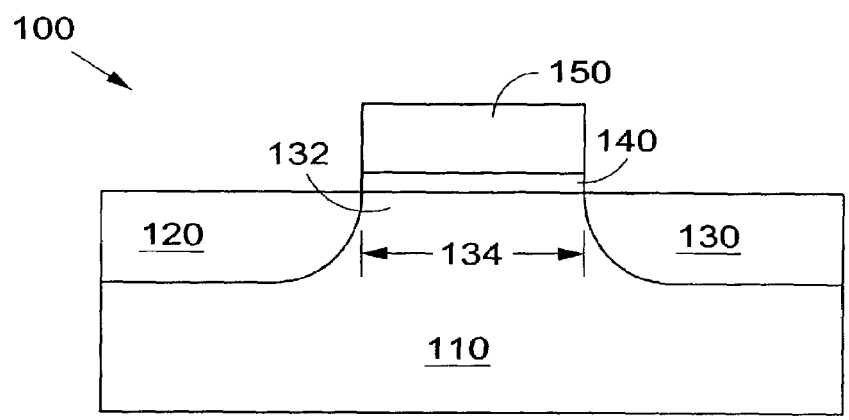
FIG. 1 depicts a common configuration of a transistor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will also have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness, $t_{eq}$, to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7–8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to $t_{eq}$ for a given capacitance with the dielectric constant of $SiO_2$, $\kappa_{ox}=3.9$, associated with $t_{eq}$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, the reduced equivalent oxide thickness of transistors can be realized by using dielectric materials with higher dielectric constants than $SiO_2$.

The thinner equivalent oxide thickness, $t_{eq}$, required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages using $SiO_2$ as a gate dielectric has been that the formation of the $SiO_2$ layer results is an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric can cause variations in the film's dielectric constant. The abovementioned material properties, including structure, are for the materials in a bulk form. Many materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

One candidate for forming gate dielectrics is $Pr_2O_3$. In co-pending, commonly assigned U.S. patent applications: entitled "Low-Temperature Grown High-Quality Ultra-Thin Praseodymium Gate Dielectrics," serial number 10/027,315, $Pr_2O_3$ is disclosed as a replacement for $SiO_2$ in forming gate dielectrics and other dielectric films in electronic devices such as MOS transistors. Additionally, in a recent article by H. J. Osten et al., Technical Digest of IEDM, pp. 653–656 (2000), crystalline praseodymium oxide on silicon was reported to have outstanding dielectric properties.

However, in a recent article by H. Zhang et al., *Journal of the Electrochemical Society*, 148 (4) pp. F63-F66 (2001), it was noted that dielectric layers using high-κ materials tend to have a narrower bandgap. The article reported investigating the use of nanolaminates of $ZrO_2/HfO_2$, $ZrO_2/Ta_2O_5$, and $Ta_2O_5/HfO_2$, instead of a single layer of either $Ta_2O_5$, $ZrO_2$, or $HfO_2$. Each nanolaminate, that is, a composite of thin alternating layers of insulators, was grown using Atomic Layer Deposition. The dielectric layers formed of these nanolaminates were reported to have a dielectric constant in the range of 9 to 16, providing a $t_{eq}$ reduction factor of about 3 relative to $SiO_2$.

Embodiments according to the teachings of the present invention provide a novel set of dielectric structures for replacing $SiO_2$ as a gate dielectric and as other dielectrics requiring an ultra-thin equivalent oxide thicknesses, $t_{eq}$. Dielectric layers containing layers of $Pr_2O_3$ and another lanthanide oxide for use as the replacement dielectric are formed in various embodiments. In one embodiment, a dielectric layer is grown by forming a layer of $Pr_2O_3$ on a substrate and forming a layer of another lanthanide oxide onto the layer of $Pr_2O_3$. In another embodiment, forming a layer of $Pr_2O_3$ on a substrate and forming a layer of another lanthanide oxide onto the layer of $Pr_2O_3$ is controlled to form a thin layer of each material with the combination of the two alternating layers of insulators forming a nanolaminate. The other lanthanide oxide used to form the nanolaminate is selected from a group consisting of $Nd_2O_3$, $Sm_2O_3$, $Gd_2O_3$, and $Dy_2O_3$. Alternately, the nanolaminate formed as the dielectric layer can be formed from multiple alternating thin layers of lanthanide oxides with the initial layer deposited being a layer of $Pr_2O_3$. Advantageously, using $Pr_2O_3$ for the initial layer provides a thin amorphous layer or region at the surface of a silicon based substrate.

By forming the dielectric layer as a nanolaminate, the dielectric layer can be grown as a composite whose insulating properties can be adjusted. The engineering of the nanolaminate allows the formation of a dielectric layer with a dielectric constant ranging between the values of the dielectric constants of the lanthanide oxides which form the dielectric layer. However, in many cases the dielectric layer will have an effective dielectric constant less than the dielectric constant of the lanthanide oxides used to form the dielectric layer. This reduction in the effective dielectric constant is due to interfacial layers formed between the silicon substrate surface and the first lanthanide oxide layer of the nanolaminate.

In one embodiment, a nanolaminate is grown by forming a layer of $Pr_2O_3$ on a substrate by electron beam evaporation. Subsequently, a layer of another lanthanide oxide is formed onto the layer of $Pr_2O_3$ also by electron beam evaporation. The resulting nanolaminate has a total thickness which is about the same as the thickness of the initial layer of $Pr_2O_3$ formed on the substrate. Thus, each layer in the nanolaminate is reduced to one-half the original thickness deposited. Such films are uniformly produced with a $t_{eq}$ less than 20 Å, typically with about a $t_{eq}$ of about 14 Å.

Figure 2:
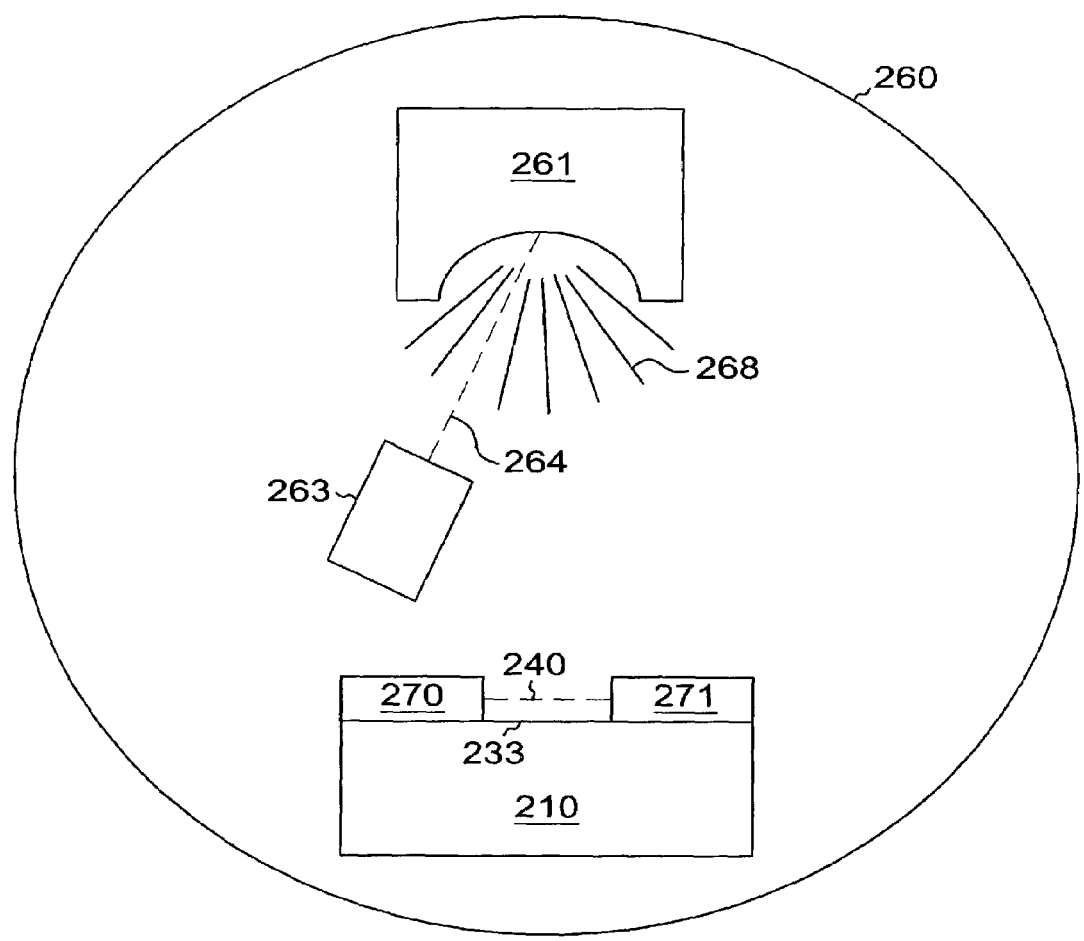
FIG. 2 depicts an embodiment of a deposition process for forming a gate dielectric using electron beam evaporation according to the teachings of the present invention.

FIG. 2 depicts an embodiment of a deposition process for forming a gate dielectric using electron beam evaporation according to the teachings of the present invention. This process can be used to deposit a material forming a film containing a layer of $Pr_2O_3$ and a layer of another lanthanide oxide on a surface such as a body region of a transistor. In FIG. 2, a substrate 210 is placed inside a deposition chamber 260. The substrate in this embodiment is masked by a first masking structure 270 and a second masking structure 271. In this embodiment, the unmasked region 233 includes a body region of a transistor, however one skilled in the art will recognize that other semiconductor device structures may utilize this process. Also located within the deposition chamber 260 is an electron gun 263 and a target 261. The electron gun 263 provides an electron beam 264 directed at target 261 containing a source material for forming $Pr_2O_3$ and other lanthanide oxides on the unmasked region 233 of the substrate 210. The electron gun 263 includes a rate monitor for controlling the rate of evaporation of the material in the target 261 at which the electron beam 264 is directed. For convenience, control displays and necessary electrical connections as are known to those skilled in the art are not shown in FIG. 2. Alternatively, a chamber can be used with multiple electron guns, where each electron gun is directed to different targets containing sources to form selected lanthanide oxides to be used at different times in the process.

During the evaporation process, the electron gun 263 generates an electron beam 264 that hits target 261. In one embodiment, target 261 contains a ceramic $Pr_6O_{11}$ source, which is evaporated due to the impact of the electron beam 264. The evaporated material 268 is then distributed throughout the chamber 260. A dielectric layer of $Pr_2O_3$ is grown forming a film 240 on the surface of the exposed body region 233 that it contacts. The growth rate can vary with a typical rate of 0.1 Å/s. The resultant $Pr_2O_3$ layer includes a thin amorphous interfacial layer of about 0.5 nm thickness separating a crystalline layer of $Pr_2O_3$ from the substrate on which it is grown. This thin amorphous layer is beneficial in reducing the number of interface charges and eliminating any grain boundary paths for conductance from the substrate. Other source materials can be used for forming the $Pr_2O_3$ layer, as are known to those skilled in the art.

Subsequent to the formation of the $Pr_2O_3$ layer, another lanthanide oxide is deposited on the film 240 converting the film 240 from a $Pr_2O_3$ layer to a nanolaminate of $Pr_2O_3$ and the other lanthanide oxide. The other lanthanide oxide is selected from the group consisting of $Nd_2O_3$, $Sm_2O_3$, $Gd_2O_3$, and $Dy_2O_3$. Depending on the lanthanide oxide selected to form the nanolaminate, a corresponding source material is used in the target 261 for electron beam evaporation. The source material for the particular lanthanide oxide is chosen from commercial materials for forming the lanthanide oxide by electron bean evaporation, as is known by those skilled in the art.

After forming the nanolaminate, the structure is annealed briefly at 600° C. As a result of this brief anneal, there is no significant hysteresis in capacitance-voltage (C-V) measurements. Further, the nanolaminates can be annealed up to 1000° C. for 15 seconds with no degradation in electrical properties. In one embodiment, such films have a $t_{eq}$ of 14 Å with a leakage current of approximately $5 \times 10^{-9}$ A/cm² at a gate voltages of ±1 V, with a dielectric constant ranging from the dielectric constant of a $Pr_2O_3$ film on silicon, 31, to the dielectric constant of the other selected lanthanide oxide. Advantageously, this leakage current is at least $10^4$ times lower that the best published value of $HfO_2$ or $ZrO_2$ films with the same $t_{eq}$ and a 3 nm thick $SiO_2$ layer.

In one embodiment alternating layers of $Pr_2O_3$ and another selected lanthanide oxide are formed by controlled electron beam evaporation providing layers of material of predetermined thickness. This control allows the engineering of a dielectric with a predetermined thickness, and composition. Through evaluation of different lanthanide oxides at various thicknesses and number of layers, a dielectric layer with a predetermined $t_{eq}$ in a narrow range of values can be grown. Alternately, after forming a $Pr_2O_3$ layer and a layer of another lanthanide oxide, additional layers of additional lanthanide oxides can be formed. Each layer of an additional lanthanide oxide selected from a group consisting of $Pr_2O_3$, $Nd_2O_3$, $Sm_2O_3$, $Gd_2O_3$, and $Dy_2O_3$. Consequently, a dielectric layer can be engineered with electrical characteristics suited for a given application. These electrical characteristics include $t_{eq}$ and leakage current. A $t_{eq}$ of less than 20 Å can be obtained with typically sizes about of about 14 Å to 8.5 Å.

In another embodiment, nanolaminates of lanthanide oxides are formed by electron beam evaporation. The lanthanide oxides used in these nanolaminates are chosen from the group consisting of $Pr_2O_3$, $Nd_2O_3$, $Sm_2O_3$, $Gd_2O_3$, and $Dy_2O_3$. The structure of the nanolaminates can be varied with any one of the group used as the initial layer formed on a substrate. Typically, the substrate is silicon based, since these lanthanide oxides are thermodynamically stable with respect to formation on a silicon surface. In an alternate embodiment, lanthanide oxide nanolaminates are formed by atomic layer deposition.

The $Pr_2O_3$ film formed on a silicon has a dielectric constant of about 31 when formed with little or no interfacial layer between the $Pr_2O_3$ film and the substrate. The dielectric constants for the other lanthanide oxides are also in the range of 25–30. As a result, a dielectric layer grown by forming a nanolaminate of lanthanide oxides has a dielectric constant in the range of about 25 to about 31. However, with an interfacial layer formed between the surface of the substrate and the first lanthanide oxide, the $t_{eq}$ of the dielectric layer is the $t_{eq}$ of the interfacial layer in parallel with the lanthanide oxide nanolaminate. Thus, the dielectric layer formed having an interfacial layer between the substrate on which it is grown and a lanthanide oxide nanolaminate can have an effective dielectric constant considerably less than a dielectric constant associated with a nanolaminate of lanthanide oxides. This is dependent upon the dielectric constant of the interfacial material being considerably less than the dielectric constant of the lanthanide oxides used to form the nanolaminate.

As previously noted above, a $Pr_2O_3$ layer can be formed on a silicon based substrate having a dielectric constant of about 31 with an interfacial layer of about 0.5 nm (5 Å). In another embodiment, for an interfacial layer of about 10.7 Å, an effective dielectric constant for a thin layer of $Pr_2O_3$ on silicon is about 15. Similar effective dielectric constants are associated with thin layers of $Nd_2O_3$, $Sm_2O_3$, $Gd_2O_3$, and $Dy_2O_3$ oxides on silicon. For example, a thin layer of $Nd_2O_3$ has an effective dielectric constant of about 12.9 with an interfacial layer of about 8.2 Å, a thin layer of $Sm_2O_3$ has an effective dielectric constant of about 11.4 with an interfacial layer of about 5.5 Å, a thin layer of $Gd_2O_3$ has an effective dielectric constant of about 13.9 with an interfacial layer of about 10 Å, and a thin layer of $Dy_2O_3$ has an effective dielectric constant of about 14.3 with an interfacial layer of about 12 Å. Lanthanide oxides grown on silicon with these reduced effective dielectric constants and corresponding interfacial layers can be attained with a $t_{eq}$ equal to about 13 Å for $Pr_2O_3$, about 12.4 Å for $Nd_2O_3$, about 12.2 Å for $Sm_2O_3$, about 13 Å for $Gd_2O_3$, and about 13.3 Å for $Dy_2O_3$. Consequently, nanolaminates of these lanthanide oxides can be formed with an effective dielectric constants in the range of 11 to 15 and a $t_{eq}$ in the range of about 12 Å to about 14 Å.

The formation of the interfacial layer is one factor in determining how thin a layer can be grown. An interfacial layer can be $SiO_2$ for many processes forming a non-$SiO_2$ dielectric on a silicon substrate. However, advantageously, in an embodiment forming a lanthanide oxide nanolaminate with an initial layer of $Pr_2O_3$, a thin amorphous interfacial layer is formed that is not a $SiO_2$ layer. Typically, this interfacial layer is either an amorphous layer primarily of $Pr_2O_3$ formed between the silicon substrate and a crystalline form of $Pr_2O_3$, or a layer of Pr—Si—O silicate. The dielectric constant for Pr—Si—O silicate is significantly greater than $SiO_2$, but not as high as $Pr_2O_3$.

Another factor setting a lower limit for the scaling of a dielectric layer is the number of monolayers of the dielectric structure necessary to develop a full band gap such that good insulation is maintained between an underlying silicon layer and an overlying conductive layer on the dielectric layer or film. This requirement is necessary to avoid possible short circuit effects between the underlying silicon layer and the overlying conductive layer used. In one embodiment, for a 0.5 nm interfacial layer and several monolayers of lanthanide grown, an expected lower limit for the physical thickness of a dielectric layer grown by forming a lanthanide oxide nanolaminate is anticipated to be in about the 2–4 nm range. Consequently, typical dielectric layers or films can be grown by forming lanthanide oxide nanolaminates having physical thickness in the range of 4 to 10 nm. The number of layers used, the thickness of each layer, and the lanthanide oxide used for each layer can be engineered to provide the desired electrical characteristics. $Pr_2O_3$ used as the initial layer is expected to provide excellent overall results with respect to reliability, current leakage, and ultra-thin $t_{eq}$.

Alternate embodiments include forming lanthanide oxide nanolaminates by electron beam evaporation with target material to form $Pr_2O_3$ other than $Pr_6O_{11}$, forming lanthanide oxide nanolaminates by atomic layer deposition, and electron beam evaporation forming lanthanide oxide nanolaminates with initial layers of a lanthanide oxide other than $Pr_2O_3$. The physical thicknesses can range from about 2 nm to about 10 nm with typical thickness ranging from about 4 nm to about 10 nm. Such layers have an effective dielectric constant ranging from 11 to 31, where a layer with a typical interfacial layer has an effective dielectric constant in the range 11 to 16 and a layer with a significantly thin interfacial layer can attain an effective dielectric constant in the range 25 to 31. Consequently, a range for the equivalent oxide thickness of a dielectric layer formed as a lanthanide oxide nanolaminate can be engineered over a significant range. The expected $t_{eq}$ ranges for various effective dielectric constants are shown in the following

| | Physical Thickness t = 0.5 nm (5Å) | Physical Thickness t = 1.0 nm (10 Å) | Physical Thickness t = 2.0 nm (20 Å) | Physical Thickness t = 10 nm (100 Å) |
|---|---|---|---|---|
| κ | $t_{eq}$ (Å) | $t_{eq}$ (Å) | $t_{eq}$ (Å) | $t_{eq}$ (Å) |
| 11 | 1.77 | 3.55 | 7.09 | 35.45 |

-continued

|    | Physical Thickness t = 0.5 nm (5Å) | Physical Thickness t = 1.0 nm (10 Å) | Physical Thickness t = 2.0 nm (20 Å) | Physical Thickness t = 10 nm (100 Å) |
|----|------|------|------|-------|
| 12 | 1.63 | 3.25 | 6.50 | 32.50 |
| 13 | 1.50 | 3.00 | 6.00 | 30.00 |
| 14 | 1.39 | 2.79 | 5.57 | 27.86 |
| 15 | 1.30 | 2.60 | 5.20 | 26.00 |
| 16 | 1.22 | 2.44 | 4.88 | 24.38 |
| 20 | 0.98 | 1.95 | 3.90 | 19.50 |
| 25 | 0.78 | 1.56 | 3.12 | 15.60 |
| 31 | 0.63 | 1.26 | 2.52 | 12.58 |

As noted previously, various embodiments provide a typical $t_{eq}$ of about 14 Å. With careful preparation and engineering of the lanthanide oxide nanolaminate limiting the size of interfacial regions, a teq down to 2.5 Å or lower is anticipated.

The novel process described above provides significant advantages by providing a straight forward method of forming dielectric layers having ultra-thin equivalent oxide thicknesses by electron beam evaporation. Praseodymium oxide-based nanolaminates provide excellent reliability characteristics, based on measurements of current density as a function of gate voltage and stress induced leakage currents for the lanthanide oxides which form the nanolaminates. The dielectric breakdown occurs a least above 43 MEV/cm. The lanthanide oxides forming the nanolaminates retain excellent J-V characteristics even after stress-induced electrical breakdown. Though the praseodymium oxide forming the first layer of the nanolaminate is epitaxially oriented with respect to a substrate on which it is formed, the praseodymium layer is separated from the substrate surface by a thin amorphous layer. Additionally, the novel process and novel dielectric layer structure can be implemented to form transistors, memory devices, and electronic systems including information handling devices.

A transistor 100 as depicted in FIG. 1 can be formed by forming a source/drain region 120 and another source/drain region 130 in a silicon based substrate 110 where the two source/drain regions 120, 130 are separated by a body region 132. The body region 132 separated by the source/drain 120 and the source/drain 130 defines a channel having a channel length 134. $Pr_2O_3$ is formed on the body region 132 by evaporation using a electron gun at a controlled rate. Subsequently, another lanthanide oxide selected from the group consisting of $Nd_2O_3$, $Sm_2O_3$, $Gd_2O_3$, and $Dy_2O_3$ is formed on the $Pr_2O_3$ layer by controlling a rate of electron beam evaporation. This controlled process forms a film 140 containing a nanolaminate of $Pr_2O_3$ and another lanthanide oxide on the body region 132. A gate 150 is formed over the gate dielectric 140. Typically, forming the gate 150 includes forming a polysilicon layer, though a metal gate can be formed in an alternative process. Forming the substrate, source/region regions, and the gate is performed using standard processes known to those skilled in the art. Additionally, the sequencing of the various elements of the process for forming a transistor is conducted with standard fabrication processes, also as known to those skilled in the art.

Figure 3:
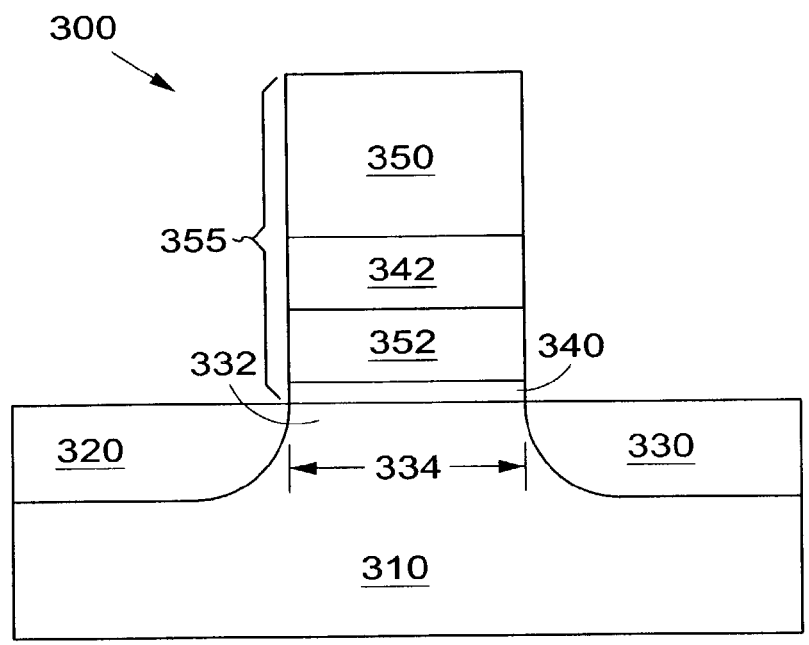
FIG. 3 depicts an embodiment of another configuration of a transistor capable of being fabricated according to the teachings of the present invention.

The method of forming lanthanide oxide nanolaminates for a gate dielectric is applied to other transistor structures having dielectric layers in various embodiments according to the teachings of the present invention. For example, the structure of FIG. 3 depicts a transistor 300 having a silicon based substrate 310 with two source/drain regions 320, 330 separated by a body region 332. The body region 332 between the two source/drain regions 320, 330 defines a channel region having a channel length 334. Located above the body region 332 is a stack 355 including a gate dielectric 340, a floating gate 352, a floating gate dielectric 342, and a control gate 350. The gate dielectric 340 can be formed as described above with the remaining elements of the transistor 300 formed using processes known to those skilled in the art. Alternately, both the gate dielectric 340 and the floating gate dielectric 342 can be formed by various embodiments in accordance with the present invention as described above.

Figure 4:
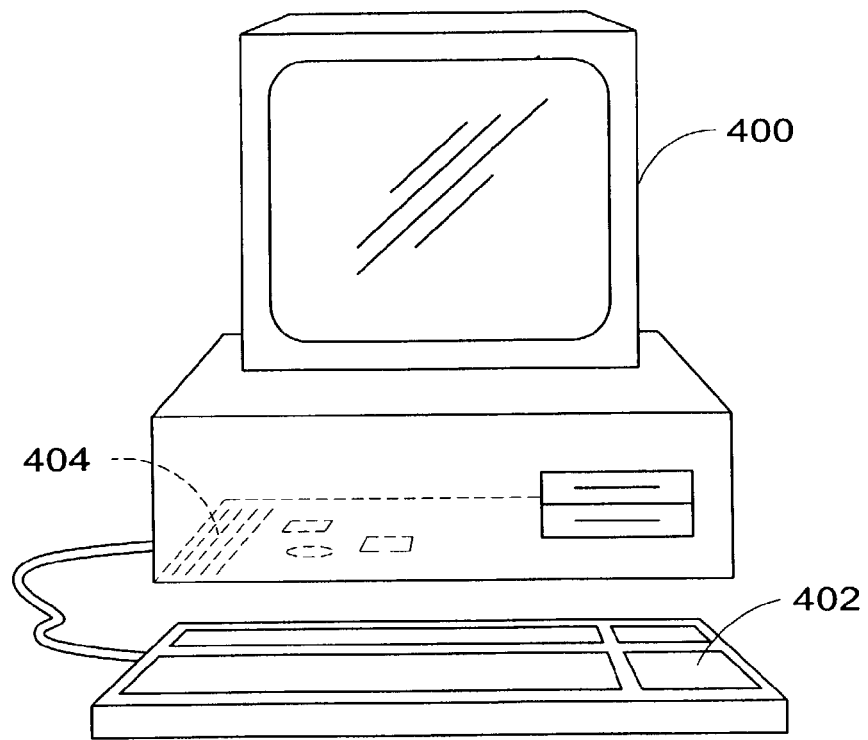
FIG. 4 illustrates a perspective view of an embodiment of a personal computer incorporating devices made according to the teachings of the present invention.
Figure 5:
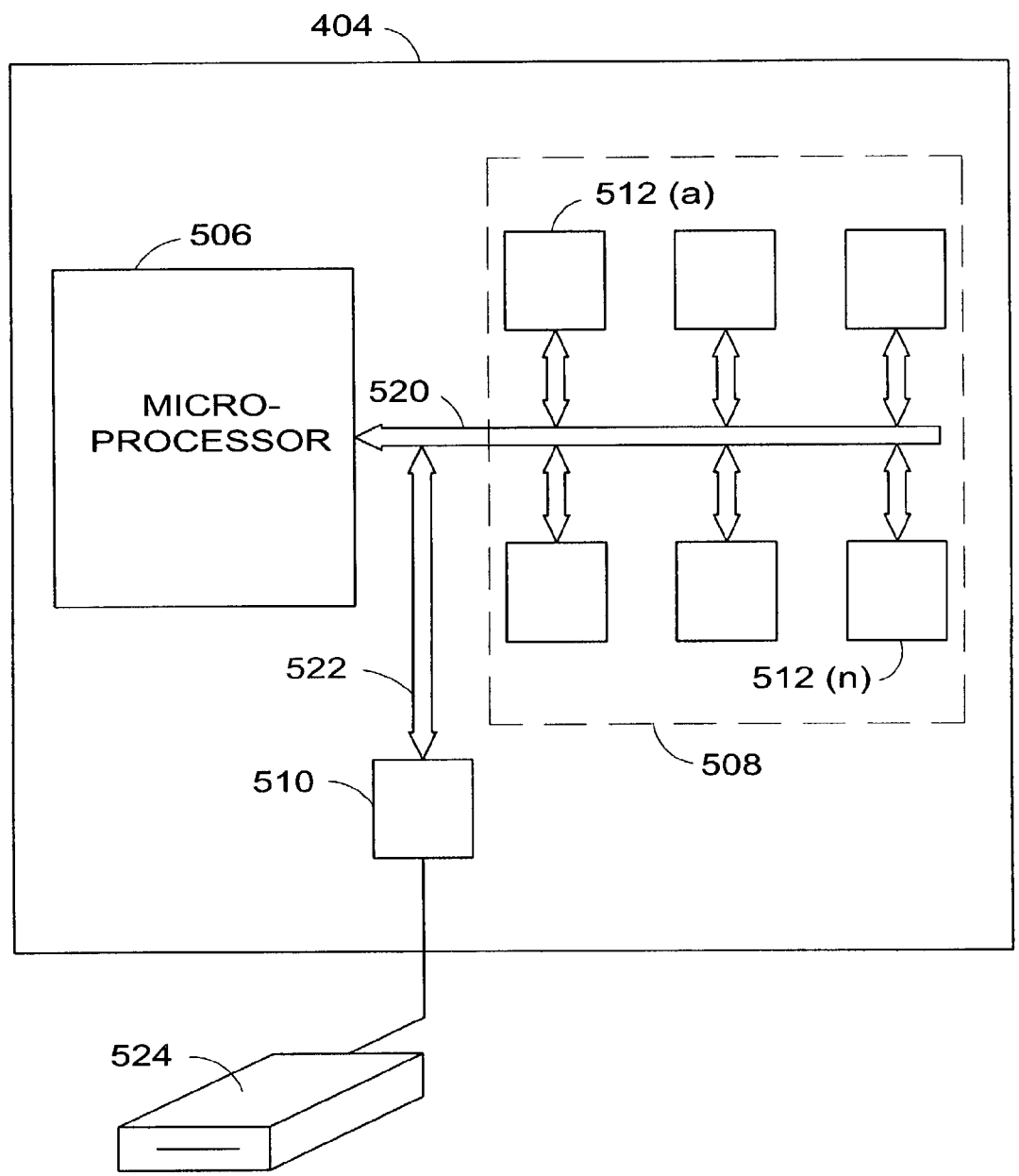
FIG. 5 illustrates a schematic view of an embodiment of a processing unit incorporating devices made according to the teachings of the present invention.
Figure 6:
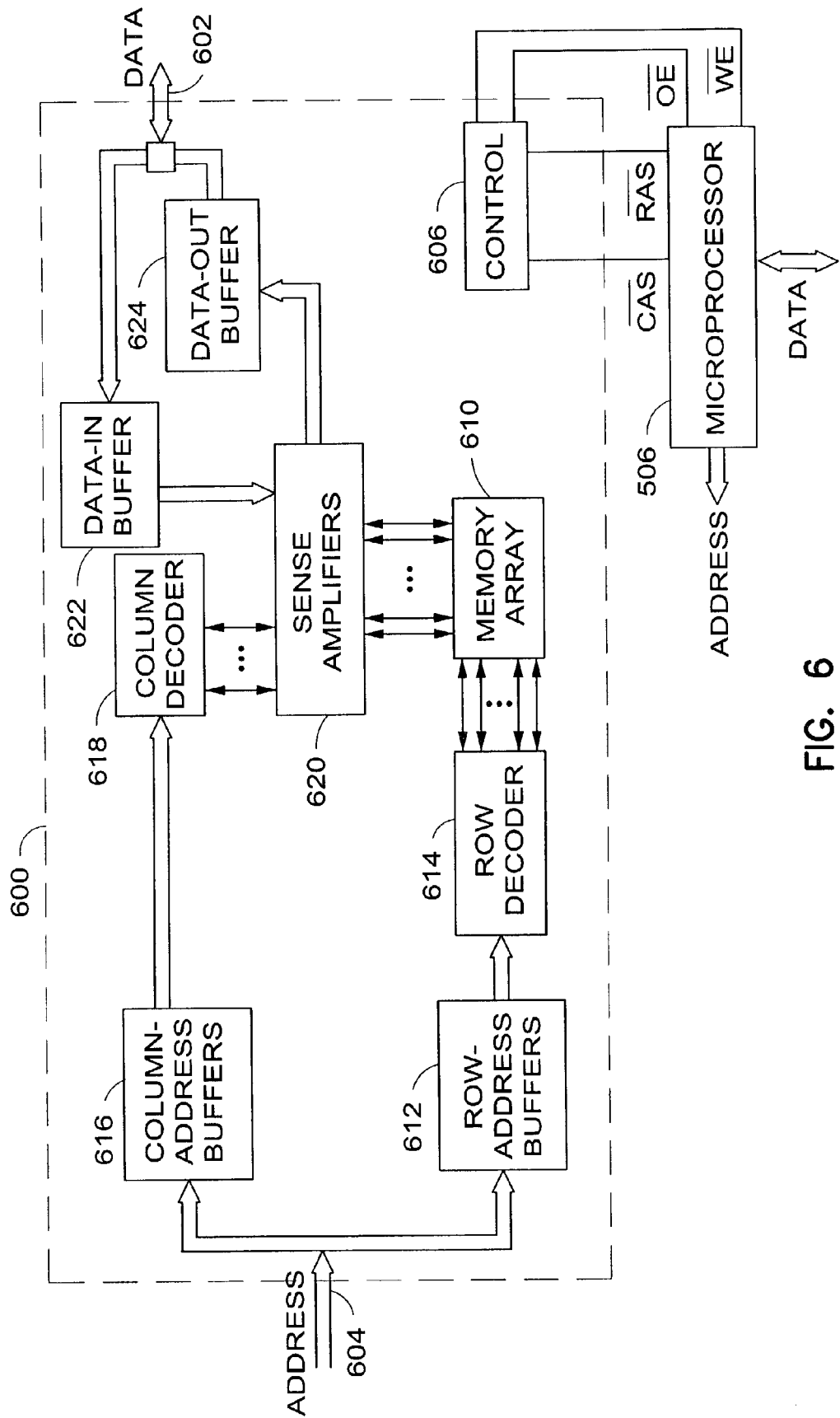
FIG. 6 illustrates a schematic view of an embodiment of a DRAM memory device according to the teachings of the present invention.

Transistors created by the methods described above may be implemented into memory devices and electronic systems including information handling devices. Information handling devices having a dielectric layer containing a lanthanide oxide nanolaminate can be constructed using various embodiments of the methods described above. Such information devices include wireless systems, telecommunication systems, and computers. An embodiment of a computer having a dielectric layer containing a lanthanide oxide nanolaminate is shown in FIGS. 4–6 and described below. While specific types of memory devices and computing devices are shown below, it will be recognized by one skilled in the art that several types of memory devices and information handling devices utilize the invention.

A personal computer, as shown in FIGS. 4 and 5, include a monitor 400, keyboard input 402 and a processing unit 404. The processor unit 404 typically includes microprocessor 506, memory bus circuit 508 having a plurality of memory slots 512(a-n), and other peripheral circuitry 510. Peripheral circuitry 510 permits various peripheral devices 524 to interface processor-memory bus 520 over input/output (I/O) bus 522. The personal computer shown in FIGS. 4 and 5 also includes at least one transistor having a gate dielectric containing a lanthanide oxide nanolaminate in an embodiment according to the teachings of the present invention.

Microprocessor 506 produces control and address signals to control the exchange of data between memory bus circuit 508 and microprocessor 506 and between memory bus circuit 508 and peripheral circuitry 510. This exchange of data is accomplished over high speed memory bus 520 and over high speed I/O bus 522.

Coupled to memory bus 520 are a plurality of memory slots 512(a-n) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 512. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 508.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 520. Other alternative types of devices include SDRAM, DDR SDRAM, SLDRAM and Direct RDRAM as well as others such as SRAM or Flash memories.

FIG. 6 is a block diagram of an illustrative DRAM device 600 compatible with memory slots 512(a-n). The description of DRAM 600 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 6 includes at least one transistor having a gate dielectric containing a lanthanide oxide nanolaminate in an embodiment according to the teachings of the present invention.

Control, address and data information provided over memory bus 520 is further represented by individual inputs to DRAM 600, as shown in FIG. 6. These individual representations are illustrated by data lines 602, address lines 604 and various discrete lines directed to control logic 606.

As is well known in the art, DRAM 600 includes memory array 610 which in turn comprises rows and columns of addressable memory cells. Each memory cell in a row is coupled to a common word line. The word line is coupled to gates of individual transistors, where at least one transistor has a gate coupled to a gate dielectric containing a layer $Pr_2O_3$ and a layer another lanthanide oxide in accordance with the method and structure previously described above. Additionally, each memory cell in a column is coupled to a common bit line. Each cell in memory array 610 includes a storage capacitor and an access transistor as is conventional in the art.

DRAM 600 interfaces with, for example, microprocessor 606 through address lines 604 and data lines 602. Alternatively, DRAM 600 may interface with a DRAM controller, a micro-controller, a chip set or other electronic system. Microprocessor 506 also provides a number of control signals to DRAM 600, including but not limited to, row and column address strobe signals RAS and CAS, write enable signal WE, an output enable signal OE and other conventional control signals.

Row address buffer 612 and row decoder 614 receive and decode row addresses from row address signals provided on address lines 604 by microprocessor 506. Each unique row address corresponds to a row of cells in memory array 610. Row decoder 614 includes a word line driver, an address decoder tree, and circuitry which translates a given row address received from row address buffers 612 and selectively activates the appropriate word line of memory array 610 via the word line drivers.

Column address buffer 616 and column decoder 618 receive and decode column address signals provided on address lines 604. Column decoder 618 also determines when a column is defective and the address of a replacement column. Column decoder 618 is coupled to sense amplifiers 620. Sense amplifiers 620 are coupled to complementary pairs of bit lines of memory array 610.

Sense amplifiers 620 are coupled to data-in buffer 622 and data-out buffer 624. Data-in buffers 622 and data-out buffers 624 are coupled to data lines 602. During a write operation, data lines 602 provide data to data-in buffer 622. Sense amplifier 620 receives data from data-in buffer 622 and stores the data in memory array 610 as a charge on a capacitor of a cell at an address specified on address lines 604.

During a read operation, DRAM 600 transfers data to microprocessor 506 from memory array 610. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 620 detects and amplifies a difference in voltage between the complementary bit lines. The sense amplifier passes the amplified voltage to data-out buffer 624.

Control logic 606 is used to control the many available functions of DRAM 600. In addition, various control circuits and signals not detailed herein initiate and synchronize DRAM 600 operation as known to those skilled in the art. As stated above, the description of DRAM 600 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of embodiments of the present invention. The DRAM implementation described herein is illustrative only and not intended to be exclusive or limiting.

Conclusion

A gate dielectric containing a layer of $Pr_2O_3$ and a layer of another lanthanide oxide, and a method of fabricating such a gate dielectric are provided that produces a reliable gate dielectric having an equivalent oxide thickness thinner than attainable using $SiO_2$. Gate dielectric structures that are formed using the methods described herein include nanolaminates of $Pr_2O_3$ and another lanthanide oxide selected from the group consisting of $Nd_2O_3$, $Sm_2O_3$, $Gd_2O_3$, and $Dy_2O_3$. These gate dielectric structures are thermodynamically stable such that the gate dielectrics formed will have minimal reactions with a silicon substrate or other structures during processing.

Transistors, higher level ICs, devices, and electronic systems are provided utilizing the novel gate dielectric and process of formation. Gate dielectric layers of lanthanide oxide nanolaminates are formed having a high dielectric constant (κ), where the gate dielectrics are capable of a $t_{eq}$ of 14 Å or thinner, providing suitable substitutes for $SiO_2$ gate dielectrics. At the same time, the physical thickness of the $Pr_2O_3$ layer is much larger than the $SiO_2$ thickness associated with the $t_{eq}$ limit of $SiO_2$. Forming the larger thickness provides advantages in processing the gate dielectric. In addition forming a dielectric layer or film containing a lanthanide oxide nanolaminate allows the engineering or selection of a dielectric constant ranging from that of $Pr_2O_3$ to a dielectric constant of another lanthanide oxide that is comprised in the nanolaminate.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method comprising:
forming a gate dielectric containing a nanolaminate, including forming the nanolaminate by:
forming a layer of a first lanthanide oxide as an initial layer on and in contact with a substrate, the first lanthanide oxide formed by electron beam evaporation; and as an amorphous layer;
forming a crystalline layer of the first lanthanide oxide on and contacting the initial layer; and
forming a layer of a second lanthanide oxide onto the crystalline layer of the first lanthanide oxide, the layer of a second lanthanide oxide formed by electron beam evaporation, wherein the first and second lanthanide oxides are different lanthanide oxides, wherein a lanthanide oxide consists essentially of oxygen and lanthanide.

2. The method of claim 1, wherein forming a layer of a first lanthanide oxide and forming a layer of a second lanthanide oxide includes forming a nanolaminate of lanthanide oxides having a layer of $Gd_2O_3$.

3. The method of claim 1, wherein forming a layer of a second lanthanide oxide by electron beam evaporation includes using a ceramic $Pr_6O_{11}$ source.

4. The method of claim 1, wherein the method further includes selectively providing a film composition having a predetermined dielectric constant ranging from a dielectric constant of a film of the first lanthanide oxide to a dielectric constant of a film of the second lanthanide oxide.

5. The method of claim 1, wherein forming a gate dielectric includes forming the gate dielectric in a transistor.

6. The method of claim 1, wherein forming a gate dielectric includes forming the gate dielectric in a transistor in a memory array.

7. The method of claim 1, wherein forming a gate dielectric includes forming the gate dielectric in a transistor in a memory array in an electronic system.

8. The method of claim 1, wherein forming a layer of a second lanthanide oxide onto the layer of the first lanthanide oxide includes forming the layer of the second lanthanide oxide onto the layer of the first lanthanide oxide, the layer of the first lanthanide oxide having a thickness, such that the thickness of the layer of the first lanthanide oxide reduces by about one-half.

9. A method comprising:
forming a gate dielectric containing a nanolaminate, including forming the nanolaminate by:
forming a layer of a first lanthanide oxide as an initial layer on and in contact with a substrate, the first lanthanide oxide formed by electron beam evaporation as an amorphous layer;
forming a crystalline layer of the first lanthanide oxide on and contacting the initial layer; and
forming a layer of a second lanthanide oxide onto the crystalline layer of the first lanthanide oxide, the layer of a second lanthanide oxide formed by electron beam evaporation, wherein forming a layer of a first lanthanide oxide and forming a layer of a second lanthanide oxide includes forming each layer of a lanthanide oxide selected from the group consisting of $Pr_2O_3$, $Nd_2O_3$, $Sm_2O_3$, $Gd_2O_3$, and $Dy_2O_3$, the first and second lanthanide oxides being different ones of the group.

10. The method of claim 9, wherein forming a layer of a second lanthanide oxide onto the crystalline layer of the first lanthanide oxide includes forming the layer of the second lanthanide oxide onto the crystalline layer of the first lanthanide oxide, the crystalline layer of the first lanthanide oxide having a thickness, such that the thickness of the crystalline layer of the first lanthanide oxide reduces by about one-half.

11. A method comprising:
forming a gate dielectric containing a nanolaminate, including forming the nanolaminate by:
forming an amorphous layer of a first lanthanide oxide as an initial layer on and in contact with a substrate, the first lanthanide oxide formed by electron beam evaporation;
forming a crystalline layer of the first lanthanide oxide on and contacting the amorphous layer; and
forming a layer of a second lanthanide oxide onto the crystalline layer of the first lanthanide oxide, the layer of a second lanthanide oxide formed by electron beam evaporation, wherein the method further comprises forming one or more additional layers of a lanthanide oxide, each of the additional layers of lanthanide oxide selected from a group consisting of $Pr_2O_3$, $Nd_2O_3$, $Sm_2O_3$, $Gd_2O_3$, and $Dy_2O_3$.

12. The method of claim 11, wherein forming a layer of a second lanthanide oxide onto the crystalline layer of the first lanthanide oxide includes forming the layer of the second lanthanide oxide onto the crystalline layer of the first lanthanide oxide, the crystalline layer of the first lanthanide oxide having a thickness, such that the thickness of the crystalline layer of the first lanthanide oxide reduces by about one-half.

13. A method comprising:
forming a gate dielectric containing a nanolaminate, including forming the nanolaminate by:
forming a an amorphous layer of $Pr_2O_3$ as an initial layer on and in contact with a substrate, the layer of $Pr_2O_3$ formed by electron beam evaporation;
forming a crystalline layer of $Pr_2O_3$ on and contacting the amorphous layer; and
forming a layer of neodymium oxide onto the crystalline layer of $Pr_2O_3$, the layer of neodymium oxide formed by electron beam evaporation, neodymium oxide consisting essentially of neodymium and oxygen.

14. The method of claim 7, wherein forming a crystalline layer of $Pr_2O_3$ on and contacting the amorphous layer and forming a layer of neodymium oxide onto the crystalline layer of $Pr_2O_3$ includes forming a film having a crystalline layer of $Pr_2O_3$ and a layer of neodymium oxide, the film having a total thickness of about the thickness of the crystalline layer of $Pr_2O_3$ formed on the substrate.

15. The method of claim 13, wherein forming a layer of another lanthanide oxide onto the crystalline layer of $Pr_2O_3$ includes forming the layer of neodymium oxide onto the crystalline layer of $Pr_2O_3$, the crystalline layer of $Pr_2O_3$ having a thickness, such that the thickness of the crystalline layer of the $Pr_2O_3$ reduces by about one-half.

16. A method comprising:
forming a gate dielectric containing a nanolaminate, including forming the nanolaminate by:
forming an amorphous layer of praseodymium oxide as an initial layer on and in contact with a substrate, the praseodymium oxide formed by electron beam evaporation, wherein praseodymium oxide essentially consists of praseodymium and oxygen;

forming a crystalline layer of praseodymium oxide on and contacting the amorphous layer of praseodymium oxide; and forming a layer of another lanthanide oxide onto the crystalline layer of praseodymium oxide, the layer of another lanthanide oxide formed by electron beam evaporation, wherein forming a layer of another lanthanide oxide includes forming a layer of a lanthanide oxide selected from the group consisting of neodymium oxide, samarium oxide, gadolinium oxide, and dysprosium oxide, wherein each lanthanide of the group essentially consists of the lanthanide and oxygen.

17. The method of claim 16, wherein the method further includes selectively providing a film composition having a predetermined dielectric constant ranging from a dielectric constant of a $Pr_2O_3$ film to a dielectric constant of a film of the selected lanthanide oxide.

18. The method of claim 16, wherein the method further comprises forming one or more additional layers of a lanthanide oxide, each of the additional layers of lanthanide oxide selected from a group consisting of $Pr_2O_3$, $Nd_2O_3$, $Sm_2O_3$, $Gd_2O_3$, and $Dy_2O_3$.

19. The method of claim 18, wherein forming one or more additional layers of lanthanide oxide includes selectively forming the one or more additional layers such that the gate dielectric has an equivalent oxide thickness less than 20 Å.

20. The method of claim 16, wherein forming a layer of another lanthanide oxide onto the crystalline layer of praseodymium oxide includes forming the layer of the another lanthanide oxide onto the crystalline layer of praseodymium oxide, the crystalline layer of praseodymium oxide having a thickness, such that the thickness of the crystalline layer of the praseodymium oxide reduces by about one-half.

21. A method comprising:
forming a gate dielectric containing a nanolaminate, including forming the nanolaminate by:
forming a layer of $Pr_2O_3$ as an initial layer on a substrate, the layer of $Pr_2O_3$ formed by electron beam evaporation; and
forming a layer of another lanthanide oxide onto the layer of $Pr_2O_3$, the layer of another lanthanide oxide formed by electron beam evaporation, wherein the lanthanide oxide is different from $Pr_2O_3$, the lanthanide oxide consisting essentially of the lanthanide and oxygen, wherein forming a layer of $Pr_2O_3$ includes forming a crystalline layer of $Pr_2O_3$ with an amorphous interfacial layer of $Pr_2O_3$ between and contacting the crystalline layer of $Pr_2O_3$ and the substrate.

22. The method of claim 21, wherein forming an amorphous layer of $Pr_2O_3$ by electron beam evaporation includes using a ceramic $Pr_6O_{11}$ source.

23. The method of claim 21, wherein the method further includes annealing both layers at temperatures up to 1000° C. for about 15 seconds.

24. A method comprising:
forming a transistor including:
forming first and second source/drain regions, the first and second regions separated by a body region on a substrate;
forming a gate dielectric containing a nanolaminate, including forming the nanolaminate by:
forming a an amorphous layer of $Pr_2O_3$ as an initial layer onto and in contact with the body region by electron beam evaporation;

forming a crystalline layer of $Pr_2O_3$ on and contacting the amorphous layer; and forming a layer of another lanthanide oxide onto the crystalline layer of $Pr_2O_3$, the layer of another lanthanide oxide formed by electron beam evaporation, wherein the lanthanide oxide is different from $Pr_2O_3$, the lanthanide oxide consisting essentially of the lanthanide and oxygen; and coupling a gate to the gate dielectric.

25. The method of claim 24, wherein forming a layer of another lanthanide oxide includes forming a layer of a lanthanide oxide selected from the group consisting of $Nd_2O_3$, $Sm_2O_3$, $Gd_2O_3$, and $Dy_2O_3$.

26. The method of claim 25, wherein the method further includes selectively providing a gate dielectric composition having a predetermined dielectric constant ranging from a dielectric constant of a $Pr_2O_3$ film to a dielectric constant of a film of the selected lanthanide oxide.

27. The method of claim 24, wherein forming a layer of another lanthanide oxide includes forming a layer of $Sm_2O_3$.

28. The method of claim 24, wherein the method further includes annealing both layers at temperatures up to 1000° C. for about 15 seconds.

29. A method comprising:
forming a memory array including:
forming a number of access transistors, at least one of the access transistors including a gate dielectric having a nanolaminate containing a layer of $Pr_2O_3$ and a layer of another lanthanide oxide, the gate dielectric formed on a body region on a substrate between a first and a second source/drain region, the nanolaminate formed by:
forming the layer of $Pr_2O_3$ as an initial layer onto and in contact with the body region by electron beam evaporation, the initial layer formed as an amorphous layer;
forming a crystalline layer of $Pr_2O_3$ on and contacting the amorphous layer; and
forming the layer of another lanthanide oxide onto the crystalline layer of $Pr_2O_3$, the layer of another lanthanide oxide formed by electron beam evaporation, wherein the lanthanide oxide is different from $Pr_2O_3$, the lanthanide oxide consisting essentially of the lanthanide and oxygen;
forming a number of word lines coupled to a number of the gates of the number of access transistors;
forming a number of source lines coupled to a number of the first source/drain regions of the number of access transistors; and
forming a number of bit lines coupled to a number of the second source/drain regions of the number of access transistors.

30. The method of claim 29, wherein forming a layer of another lanthanide oxide includes forming a layer of a lanthanide oxide selected from the group consisting of $Nd_2O_3$, $Sm_2O_3$, $Gd_2O_3$, and $Dy_2O_3$.

31. The method of claim 30, wherein the method further includes selectively providing a gate dielectric composition having a predetermined dielectric constant ranging from a dielectric constant of a $Pr_2O_3$ film to a dielectric constant of a film of the selected lanthanide oxide.

32. The method of claim 30, wherein the method further comprises forming one or more additional layers of a lanthanide oxide, each of the additional layers of lanthanide oxide selected from a group consisting of $Pr_2O_3$, $Nd_2O_3$, $Sm_2O_3$, $Gd_2O_3$, and $Dy_2O_3$.

33. The method of claim 29, wherein forming a layer of another lanthanide oxide includes forming a layer of $Nd_2O_3$.

34. A method comprising:
forming an electronic system including:
providing a processor;
coupling a memory array to the processor, wherein the memory array includes at least one access transistor having a gate dielectric having a nanolaminate containing a layer of $Pr_2O_3$ and a layer of another lanthanide oxide, wherein the lanthanide oxide is different from $Pr_2O_3$, the lanthanide oxide consisting essentially of the lanthanide and oxygen, the gate dielectric formed on a body region on a substrate between a first and a second source/drain region, the nanolaminate formed by:
forming the layer of $Pr_2O_3$ as an initial layer en formed as an amorphous layer onto and in contact with the body region by electron beam evaporation;
forming a crystalline layer of $Pr_2O_3$ on and contacting the amorphous layer; and
forming the layer of another lanthanide oxide onto the crystalline layer of $Pr_2O_3$, the layer of another lanthanide oxide formed by electron beam evaporation, the lanthanide oxide consisting essentially of the lanthanide and oxygen; and
forming a system bus that couples the processor to the memory array.

35. The method of claim 34, wherein forming a layer of another lanthanide oxide includes forming a layer of a lanthanide oxide selected from the group consisting of $Nd_2O_3$, $Sm_2O_3$, $Gd_2O_3$, and $Dy_2O_3$.

36. The method of claim 35, wherein the method further includes selectively providing a gate dielectric composition having a predetermined dielectric constant ranging from a dielectric constant of a $Pr_2O_3$ film to a dielectric constant of a film of the selected lanthanide oxide.

37. The method of claim 34, wherein forming a layer of another lanthanide oxide includes forming a layer of $Dy_2O_3$.

38. A method comprising:
forming a gate dielectric containing a nanolaminate, including forming the nanolaminate by:
forming an amorphous layer of a first lanthanide oxide on a substrate by electron beam evaporation;
forming a crystalline layer of the first lanthanide oxide on and contacting the amorphous layer of the first lanthanide oxide; and
forming a layer of a second lanthanide oxide onto the crystalline layer of the first lanthanide oxide, the layer of a second lanthanide oxide formed by electron beam evaporation, wherein the first and second lanthanide oxides are different lanthanide oxides, wherein a lanthanide oxide consists essentially of oxygen and lanthanide, wherein forming an amorphous layer of a first lanthanide oxide on a substrate includes forming the amorphous layer of a first lanthanide oxide contacting the substrate such that silicon dioxide is not formed between the substrate and the nanolaminate.

39. A The method of claim 38, wherein
forming an amorphous layer of a first lanthanide oxide on a substrate includes forming the amorphous layer with a thickness of 5 Å.

40. The method of claim 38, wherein forming a gate dielectric containing a nanolaminate includes forming the nanolaminate having a layer of $Gd_2O_3$.

41. The method of claim 38, wherein forming a gate dielectric containing a nanolaminate includes forming the nanolaminate having a layer of $Nd_2O_3$.

42. The method of claim 38, wherein forming a gate dielectric containing a nanolaminate includes forming the nanolaminate having a layer of $Sm_2O_3$.

43. The method of claim 38, wherein forming a gate dielectric containing a nanolaminate includes forming the nanolaminate having a layer of $Dy_2O_3$.

* * * * *

UNITED STATES PATENT AND TRADEMARK OFFICE
CERTIFICATE OF CORRECTION

PATENT NO.         : 7,205,218 B2
APPLICATION NO. : 10/163686
DATED                : April 17, 2007
INVENTOR(S)        : Ahn et al.

It is certified that error appears in the above-identified patent and that said Letters Patent is hereby corrected as shown below:

In column 13, line 11, in Claim 1, after "evaporation" delete "; and".

In column 14, line 37, in Claim 13, after "forming" delete "a".

In column 14, line 47, in Claim 14, delete "Claim 7" and insert -- Claim 13 --, therefor.

In column 15, line 65, in Claim 24, after "forming" delete "a".

In column 17, line 16, in Claim 34, after "layer" delete "en".

In column 18, line 22, in Claim 39, before "The" delete "A".

Signed and Sealed this

Nineteenth Day of June, 2007

JON W. DUDAS
*Director of the United States Patent and Trademark Office*